(12) United States Patent
Villarino-Villa et al.

(10) Patent No.: US 11,288,146 B2
(45) Date of Patent: Mar. 29, 2022

(54) METHOD, CLOCK RECOVERY MODULE AS WELL AS COMPUTER PROGRAM FOR RECOVERING A CLOCK SIGNAL FROM A DATA SIGNAL

(71) Applicant: Rohde & Schwarz GmbH & Co. KG, Munich (DE)

(72) Inventors: Ruben Villarino-Villa, Munich (DE); Bernhard Nitsch, Munich (DE); Adrian Ispas, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 147 days.

(21) Appl. No.: 16/693,094

(22) Filed: Nov. 22, 2019

(65) Prior Publication Data
US 2020/0167246 A1 May 28, 2020

(30) Foreign Application Priority Data

Nov. 22, 2018 (EP) .................................... 18207909
Dec. 4, 2018 (EP) .................................... 18210250

(51) Int. Cl.
*G06F 11/00* (2006.01)
*G06F 11/16* (2006.01)
*G06F 1/08* (2006.01)
*G06F 11/07* (2006.01)

(52) U.S. Cl.
CPC ............ *G06F 11/1679* (2013.01); *G06F 1/08* (2013.01); *G06F 11/076* (2013.01); *G06F 11/0757* (2013.01); *G06F 11/1604* (2013.01)

(58) Field of Classification Search
CPC ............. G06F 11/1679; G06F 11/0757; G06F 11/076; G06F 11/1604; G06F 11/1675; G06F 1/08
See application file for complete search history.

(56) References Cited

U.S. PATENT DOCUMENTS

| | | | |
|---|---|---|---|
| 5,295,155 A | 3/1994 | Gersbach et al. | |
| 6,963,992 B1 * | 11/2005 | Cheng | G06F 1/08 713/300 |
| 7,016,447 B1 * | 3/2006 | Reuveni | H04L 7/0338 327/144 |
| 2004/0123018 A1 | 6/2004 | Miller et al. | |
| 2007/0064848 A1 * | 3/2007 | Desai | H03L 7/0814 375/355 |
| 2007/0253475 A1 * | 11/2007 | Palmer | H04L 25/03273 375/229 |
| 2010/0141308 A1 | 6/2010 | Villarino-Villa et al. | |
| 2020/0169261 A1 * | 5/2020 | Ryu | H03L 7/091 |

* cited by examiner

*Primary Examiner* — Joseph D Manoskey
(74) *Attorney, Agent, or Firm* — Christensen O'Connor Johnson Kindness PLLC (57) ABSTRACT

A method for recovering a clock signal from a data signal by using a clock recovery module is described. Edge timings of the data signal are accumulated. The edge timings accumulated are transformed into one reference bit period. A time offset for the reference bit period is determined. A reference clock signal is determined based on the time offset. The number of bits within a system clock of the clock recovery module is determined. The clock signal is recovered based on the reference clock signal and the number of bits. Further, a clock recovery module as well as a computer program are described.

20 Claims, 4 Drawing Sheets

METHOD, CLOCK RECOVERY MODULE AS WELL AS COMPUTER PROGRAM FOR RECOVERING A CLOCK SIGNAL FROM A DATA SIGNAL

CROSS-REFERENCES TO RELATED APPLICATIONS

This application claims priority to European Application No. 18207909.5, filed Nov. 22, 2018, and to European Application No. 18210250.9, filed Dec. 4, 2018, the disclosures of which are hereby incorporated by reference in their entirety.

FIELD OF THE DISCLOSURE

Embodiments of the present disclosure generally relate to a method for recovering a clock signal from a data signal. Further, embodiments of the present disclosure relate to a clock recovery module for recovering a clock signal from a data signal as well as a computer program for recovering a clock signal from a data signal.

BACKGROUND

Several serial transmission protocols, for example transmission protocols for high data rates, do not have a dedicated clock signal so that a clock data recovery (CDR) based on the data signal is required.

In the state of the art, clock data recovery is done by means of a phase-locked loop (PLL) based clock data recovery. Typically, analog components are used in order to avoid major delays in the feedbacks done by the PLL based clock recovery which might have an impact on the function and stability of the respective system used for clock data recovery.

In addition, digital solutions for clock data recovery are known in the state of the art.

For instance, phase interpolation techniques are used wherein the phase or rather the phase position of the clock signal is corrected in a feedback-controlled manner. The phase information of the data signal as well as the one of the clock signal are compared and used for controlling a phase interpolation. Thus, the respective information gathered is used for reconstructing the clock signal. The phase interpolation techniques ensure to track frequency shifts, for instance frequency shifts that occur in spread spectrum clocking (SSC) modulations. However, the technique is critical with regard to latency due to the feedback.

Another concept is based on sampling the data signal with a high sampling rate in an uncontrolled manner, also called blind oversampling. Edges in the data signal are detected which are used for determining the sampling times for generating the clock signal and recovering the respective data. Hence, no feedback is necessary. However, larger frequency shifts are critical that may occur due to spread-spectrum clocking modulations.

Accordingly, there is a need for a possibility enabling clock data recovery for n-ary serial signals, e.g. PAM-n signals, at high data rates with a large area of application.

SUMMARY

Embodiments of the present disclosure inter alia provide a method for recovering a clock signal from a data signal by using a clock recovery module. In an embodiment, the clock recovery module includes the following steps:

Accumulating edge timings of the data signal,
Transforming the edge timings accumulated into one reference bit period,
Determining a time offset for the reference bit period,
Determining a reference clock signal based on the time offset,
Determining the number of bits within a system clock of the clock recovery module, and
Recovering the clock signal based on the reference clock signal and the number of bits.

Moreover, embodiments of the present disclosure provide a clock recovery module for recovering a clock signal from a data signal, comprising an accumulation and compensation calculation module, an offset selection module, a front clock generation module and a clock module, wherein the accumulation and compensation calculation module is configured to accumulate edge timings of the data signal,
the accumulation and compensation calculation module is configured to transform the edge timings accumulated into one reference bit period,
the offset selection module is configured to determine a time offset for the reference bit period,
the front clock generation module is configured to determine a reference clock signal based on the time offset,
the front clock generation module is configured to determine the number of bits within a system clock of the clock recovery module, and
the clock module is configured to recover the clock signal based on the reference clock signal and the number of bits.

In some embodiments, the clock recovery module, accumulation and compensation calculation module, an offset selection module, a front clock generation module and a clock module described herein can comprise hardware and/or software portions, hardware and/or software modules, etc. Some of the method steps set forth above may be implemented in hardware and/or in software. In some embodiments, the method steps may be implemented, for example, only in software. In some embodiments, the method steps may be implemented, for example, only in hardware.

In addition, embodiments of the present disclosure provide a computer program for recovering a clock signal from a data signal by using a clock recovery module comprising an accumulation and compensation calculation module, an offset selection module, a front clock generation module and a clock module, wherein the computer program comprises a program code being adapted to cause the clock recovery module to perform the following steps when the computer program is run on the clock recovery module:

Accumulating edge timings of the data signal,
Transforming the edge timings accumulated into one reference bit period,
Determining a time offset for the reference bit period,
Determining a reference clock signal based on the time offset,
Determining the number of bits within a system clock of the clock recovery module, and
Recovering the clock signal based on the reference clock signal and the number of bits.

The underlying idea is to provide a clock data recovery for n-ary signals, e.g. PAM-n, wherein a feed-forward structure is used instead of a feedback structure being critical with regard to latency issues such as a phase-locked loop. In addition, data signals with jitter, frequency shifts or larger frequency variations can be processed appropriately, for instance spread spectrum clocking (SSC) modulated signals.

Moreover, data rates higher than 10 Gbps at system clock rates of 250 MHz can be achieved. Thus, a highly parallel implementation is obtained.

A bit comprises a 2-ary symbol having the states '0' or '1'. For n-ary signals, e.g. PAM4, the bit means an n-ary symbol, e.g. a 4-ary bit.

The edge timings correspond to the temporal edge positions in the data signal, namely the positions of data signal threshold transitions or level transitions.

The transformation of the edge timings for obtaining the reference bit period relates to a modulo transformation allowing a statistical evaluation of the edge timings within a bit period. Put it another way, the edge timings are transformed in one bit period interval for further evaluation by applying the respective modulo transformation.

The bit period used may be set, for example pre-set initially.

The time offset for the reference bit period is chosen from a number of time offset values wherein the time offset chosen corresponds to a base value for the clock signal. The respective time offset is chosen by applying a criterion which shall be fulfilled, for instance an argument of minimum, also called arg min.

Once the time offset used as the base value has been chosen, the reference clock signal can be determined. For instance, the time offset chosen is used to determine the last edge timing within the system clock by taking the bit period into account so as to determine the reference clock signal.

In addition, the number of edges within the system clock can be determined. Put it another way, the number of bit periods is verified that are present in the system clock.

The different modules of the clock recovery module may relate to software modules.

Generally, the clock data recovery is based on edge timings of the data signal which are accumulated and processed in an appropriate manner wherein the respective edges were indirectly defined previously, in particular via thresholds applied on the data signal.

The clock signal may be recovered by an interpolation on the reference clock signal and the number of bits. The reference clock signal as well as the number of bit periods are used for recovering the clock signal by performing an interpolation on the respective data. In some examples, the clock signal recovery is done by an interpolation in case that the data signal has a data rate which is substantially equal or higher than the system clock rate.

Hence, the clock module may be a clock interpolation module.

According to an aspect, another clock signal is estimated based on the edge timings. The other clock signal is particularly used for clock recovery with low bandwidth. The other clock signal may be estimated via a post-processing unit that is connected with the clock module so as to obtain the already determined clock signal. The post-processing unit may provide a feedback signal to the accumulation and compensation calculation module, the offset selection module and/or the front clock generation module. The other clock signal may correspond to clock signal timings estimated based on the bit period as well as the edge timings wherein the bit period is also estimated by applying a criterion to be fulfilled.

For estimating the other clock signal, the already determined clock signal may be used.

Moreover, a bit period may be estimated. The bit period may be estimated based on the edge timings, in particular via the post-processing unit. In addition, the bit period may be estimated by a bit period calculation module. The bit period estimated may also be fed back to the accumulation and compensation calculation module, the offset selection module and/or the front clock generation module. The bit period may be estimated by applying a criterion to be fulfilled.

Accordingly, a post-processing unit may be provided that is configured to estimate the bit period and/or the other clock signal based on the edge timings.

According to another aspect, several system clocks are summarized to a virtual system clock, wherein the virtual system clock is de-virtualized afterwards. Hence, a virtualization and normalization module may be provided that is configured to summarize several system clocks to a virtual system clock and to normalize the edge timings within the virtual system clock. Further, a de-normalization and de-virtualization module may be provided that is configured to reverse the result of the virtualization and normalization module. In some examples, the edge timings in the virtual system clock are normalized, wherein the normalized edge timings are de-virtualized after the clock signal is recovered.

The data signal comprising several valid edge timings in a system clock wherein the several edge timings define their relative position within the system clock. For data rates being lower than the system clock, $2^{(\mu\_"VSP")}$ system clocks can be summarized to the virtual system clock for being processed appropriately. Moreover, the edge timings may be normalized so that they correspond to their position within the virtual system clock.

After the processing, in particular the clock data recovery, the virtualization and normalization is reversed in the de-normalization and de-virtualization module so that the signal clock timings obtained relate to clock signals instead of the virtual ones.

Another aspect provides that the value of the time offset determined is corrected to obtain a corrected time offset, and wherein the corrected time offset is the sum of the time offset determined and averaged deviations from the time offset determined. The time offset determined is corrected by adding the respective averaged deviations from the time offset determined which were previously used for determining the time offset. The averaged deviations from the time offset determined correspond to the sum of the respective deviations divided by the number of deviations summed up. The respective deviations were obtained when choosing the time offset by comparing the different time offset values available.

In addition, a bit period calculation module may be provided that is configured to feed back an estimated bit period to the accumulation and compensation calculation module, the offset selection module and/or the front clock generation module. The optional bit period calculation module provides a feedback to the respective modules ensuring that data spread spectrum clocking (SSC) modulated signals can be handled that have larger frequency shifts with slow change. Due to the slow change, the feedback used is not latency critical. The estimation of the bit period may be done by means of an infinite impulse response filter (IIR filter).

In case of no feedback by the bit period calculation module, the nominal bit period is used which was set.

According to another aspect, a transition density calculation module is provided that is configured to determine a mean value of the clock signals and edge timings. The transition density calculation module can be used for determining and applying thresholds with regard to the mean value of the clock signals and edge timings wherein a respective indication may be set or rather output to inform the user. In other words, an allowable range for the mean value of the clock signals and edge timings may be set by the transition density calculation module wherein a respective indication, labeling or rather marker is output depending on a violation of the allowable range or not. The violation may correspond to an exceeding or rather a falling below the respective threshold(s).

Furthermore, the number of accumulated edge timings can be chosen. The clock data recovery can be set appropriately by choosing the number of accumulated edge timings as well as the update rate of the bit period estimation.

Generally, the clock recovery module may be configured to perform the method for recovering a clock signal from a data signal mentioned above. Hence, the clock recovery module may also be configured to run the computer program described above.

Since the different modules of the clock recovery module may relate to software modules, the overall clock recovery module may be established by a processor that may run the computer program.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
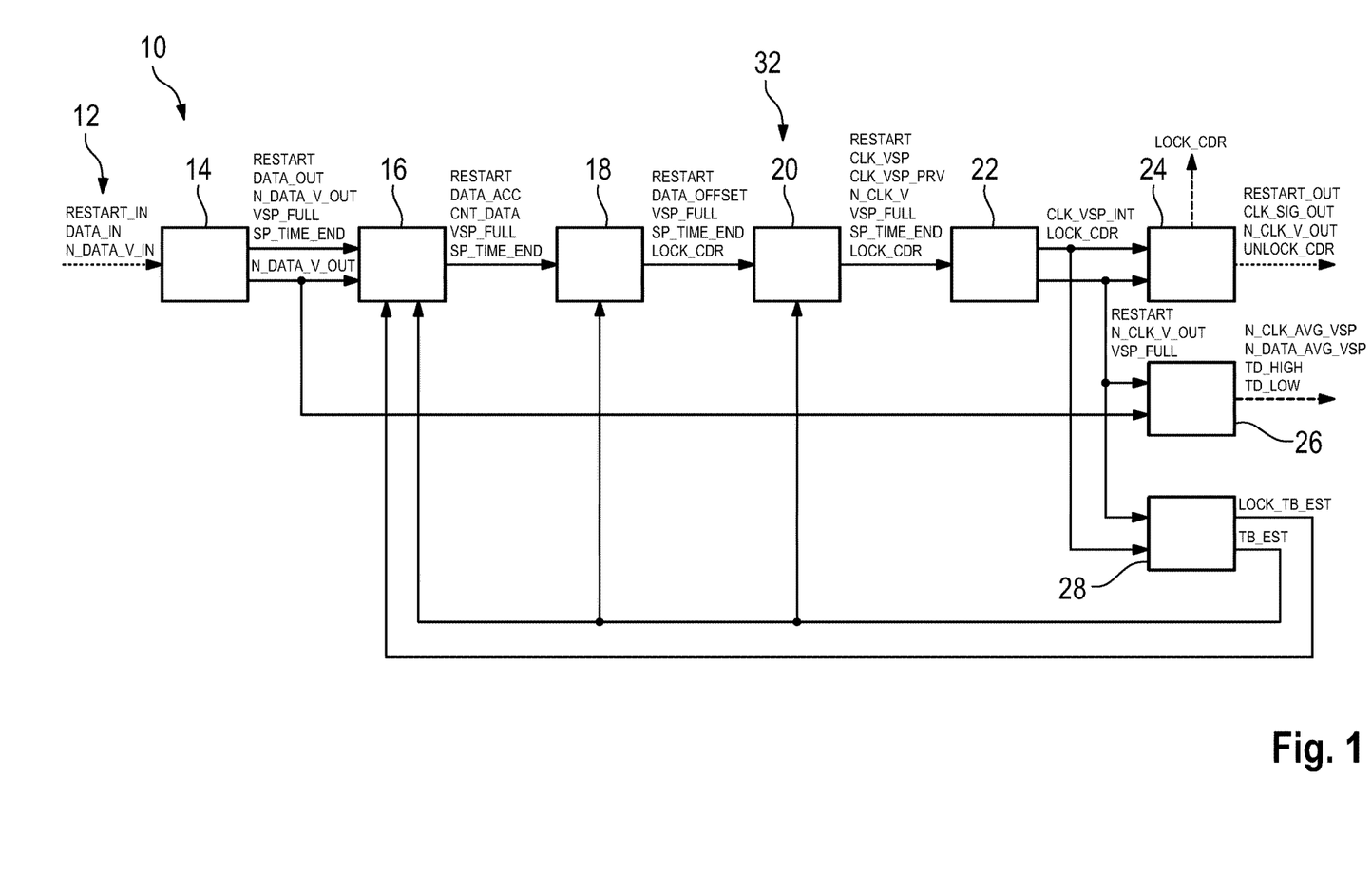
FIG. 1 schematically shows a clock recovery module according to an embodiment of the present disclosure.

In FIG. 1 a clock recovery module 10 is shown that has an input 12 via which a data signal to be processed is received.

In the shown embodiment, the clock recovery module 10 has an optional virtualization and normalization module 14 that is connected with the input 12 so that the data signal received or rather respective information of the data signal is forwarded to the virtualization and normalization module 14.

In fact, the above-mentioned data or rather information is received by the clock recovery module 10 anyway so as to start recovering the clock signal from the data signal.

The clock recovery module 10 further comprises an accumulation and compensation calculation module 16 that is connected with the virtualization and normalization module 14.

The accumulation and compensation calculation module 16 is inter alia configured to accumulate the edge timings of the data signal that are forwarded to the accumulation and compensation calculation module 16.

Figure 2:
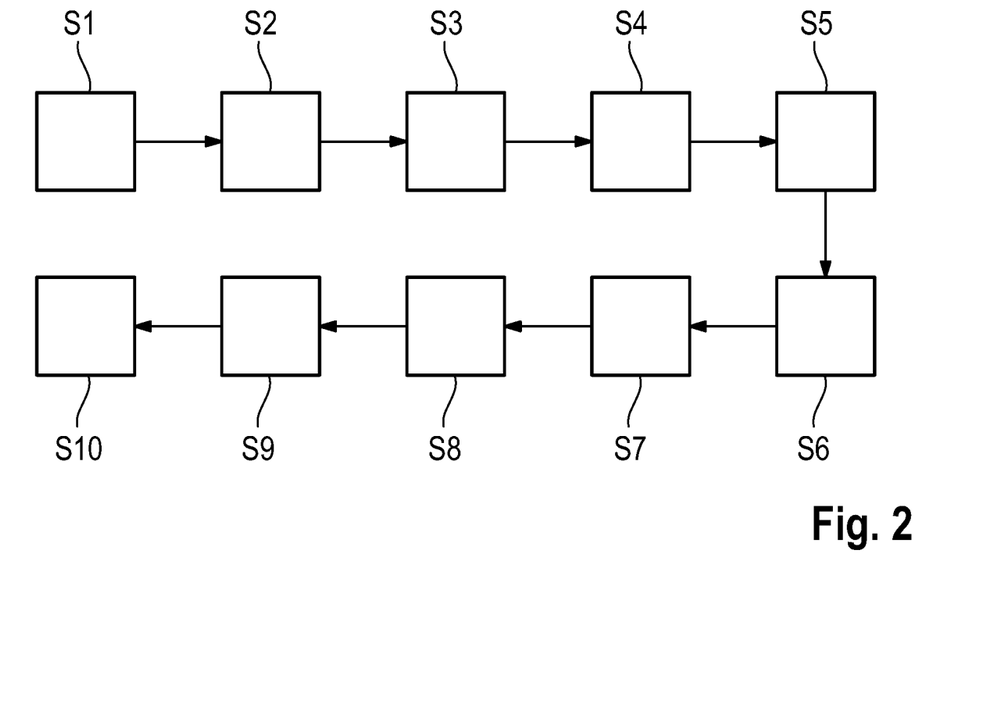
FIG. 2 shows a flow-chart illustrating a method for recovering a clock signal from a data signal according to an embodiment of the present disclosure.

Further, the accumulation and compensation calculation module 16 is configured to transform the edge timings accumulated into one reference bit period (with respect to one reference bit period) that is used for further processing as will be described later with respect to FIG. 2 when the overall method for recovering the clock signal from the data signal by using the clock recovery module 10 is described.

The clock recovery module 10 also comprises an offset selection module 18 that is connected with the accumulation and compensation calculation module 16 so as to receive at least the reference bit period determined previously, namely the transformed edge timings accumulated determined previously.

The offset selection module 18 is configured to determine a time offset for the reference bit period.

In addition, the clock recovery module 10 comprises a front clock generation module 20 that is connected with the offset selection module 18 so as to receive at least the time offset determined previously.

The front clock generation module 20 is configured to determine a reference clock signal based on the time offset received.

Further, the front clock generation module 20 is configured to determine the number of bits within a system clock of the clock recovery module 10.

The system clock may relate to the virtual system clock provided that the optional virtualization and normalization module 14 is provided.

The clock recovery module 10 further comprises a clock module 22 that is connected with the front clock generation module 20.

The clock module 22 is configured to receive the number of bits determined by the front clock generation module 20 as well as the reference clock signal determined by the front clock generation module 20. Thus, the number of bits determined as well as the reference clock signal are forwarded to the clock module 22.

The clock module 22 may be a clock interpolation module.

Moreover, the clock recovery module 10 may have an optional de-normalization and de-virtualization module 24 that is connected with the clock module 22. In fact, the de-normalization and de-virtualization module 24 is configured to reverse the result of the virtualization and normalization module 14. Accordingly, the optional de-normalization and de-virtualization module 24 is provided in case that the optional virtualization and normalization module 14 is provided.

In addition, the clock recovery module 10 may have an optional transition density calculation module 26 that is connected with the clock module 22 as well as the virtual and normalization module 14 being optional as discussed above.

The transition density calculation module 26 is configured to determine a mean value of the clock signals and edge timings.

Furthermore the clock recovery module 10 may optionally comprise a bit period calculation module 28 that is connected with the clock module 22. The bit period calculation module 28 is configured to feed back an estimated bit period to the accumulation and compensation calculation module 16, the offset selection module 18 and/or the front clock generation module 20.

Thus, the accumulation and compensation calculation module 16, the offset selection module 18 and/or the front clock generation module 20 may use the bit period estimated instead of the set one.

Hereinafter, reference is made to FIG. 2 for describing the method for recovering the clock signal from the data signal by using the clock recovery module 10 shown in FIG. 1, which is generally called clock data recovery (CDR).

In a general first step S1, thresholds for distinguishing the status of the binary data signal are defined, namely 0 and 1 of the data signal. Based on these thresholds, edge timings of the data signal are calculated, for instance the timings of exceeding or rather reaching the threshold(s) set. The respective edge timings are forwarded to the clock recovery module 10 via its input 12 as an input signal.

The clock signal timings, which define the clock signal, are recovered based on the edge timings of the data signal by using the clock recovery module 10 shown in FIG. 1 as will be discussed hereinafter in more detail.

In a second step S2, the virtualization and normalization module 14 receives via the input 12 the signal for resetting the clock data recovery (RESTART_IN), the number of valid edge timings $N_{Data,V}[k]$ (N_DATA_V_IN) in system clock k of the clock recovery module 10 as well as the respective edge timings $T_{Data}[k, l]$ with parallelism $P_{Data}$ (DATA_IN) wherein $l=0, \ldots, P_{Data}-1$ in samples.

The number of valid edge timings $N_{Data,V}[k]$ as well as the respective edge timings $T_{Data}[k, l]$ are calculated based on the thresholds set in step S1.

In fact, the edge timings $T_{Data}[k, l]$ define the positions of the edges within the system clock with a sub-sample resolution.

The virtualization and normalization module 14 may generally summarize several system clocks to a virtual system clock, for example $2^{\mu_{VSP}}$ system clocks in case of data rates being lower than the system clock rate.

The edge timings are further normalized so that their respective positions correspond to the positions within the virtual system clock. The normalization can be done as follows:

$$\tilde{T}_{Data}[k,l]=(T_{VSP}[k]+T_{Data}[k,l])\cdot 2^{-\mu_{VSP}},$$

wherein $T_{VSP}[k]$ defines the offset of the current system clock, namely the k-th one, in the virtual system clock in samples.

The virtualization and normalization module 14 outputs the signal for resetting the clock data recovery (RESTART), the normalized edge timings $\tilde{T}_{Data}[k, l]$ (DATA_OUT), the number of edge timings $N_{Data,V}[k]$ (N_DATA_V_OUT), an indicator, marker or rather label for indicating the end of the virtual system clock (VSP_FULL) and an ending time of the current system clock (SP_TIME_END).

In the shown embodiment, the edge timings are forwarded after being normalized.

The respective data output is forwarded to the accumulation and compensation calculation module 16 as shown in FIG. 1.

Provided that no virtualization and normalization module 14 is provided, the edge timings $T_{Data}[k, l]$ would be forwarded to the accumulation and compensation calculation module 16 directly.

In a third step S3, the accumulation and compensation calculation module 16 receives the data output wherein $N_{Data,Acc}$ edges are accumulated and their respective values $T_{Acc}[k, l]$ are updated continuously, namely the positions of the edges within the (virtual) system clock or the positions of the edges within a bit period within the (virtual) system clock. In fact, the (virtual) system clock may comprise several bit periods. Put it another way, $N_{Data,Acc}$ edges are kept for further processing. The respective number may be set or rather pre-defined.

The accumulated edges $N_{Data,Acc}$ provide the basis for calculating the clock signal and, therefore, the number is of high importance with regard to the performance and resource consumption of the clock data recovery.

The accumulation and compensation calculation module 16 accumulates the last $N_{Data,Acc}$ edges received, which means that the respective number of edges $N_{Data,Acc}$ are kept.

Further, the accumulation and compensation calculation module 16 compensates the values of the edges in order to transform them into one reference bit period within the current (virtual) system clock by applying a modulo transformation.

New (non-negative) edge timings from the current system clock k are calculated by using the (standardized) bit period $\tilde{T}_b[k]$ as follows:

$$T_{Acc}[k,l]=\tilde{T}_{Data}[k,l] \bmod \tilde{T}_b[k], l=0, \ldots, N_{Data,Acc}-1$$

If there is also a change to a new virtual system clock at the transition from system clock k−1 to system clock k, the existing accumulated edge timings $T_{Acc}[k, l]$ are additionally updated with the number of samples per system clock $N_{Smp}$ as follows:

$$T_{Acc}[k,l]=(T_{Acc}[k-1,l]-N_{Smp}) \bmod \tilde{T}_b[k],$$
$$l=0, \ldots, N_{Data,Acc}-1$$

Figure 4A:
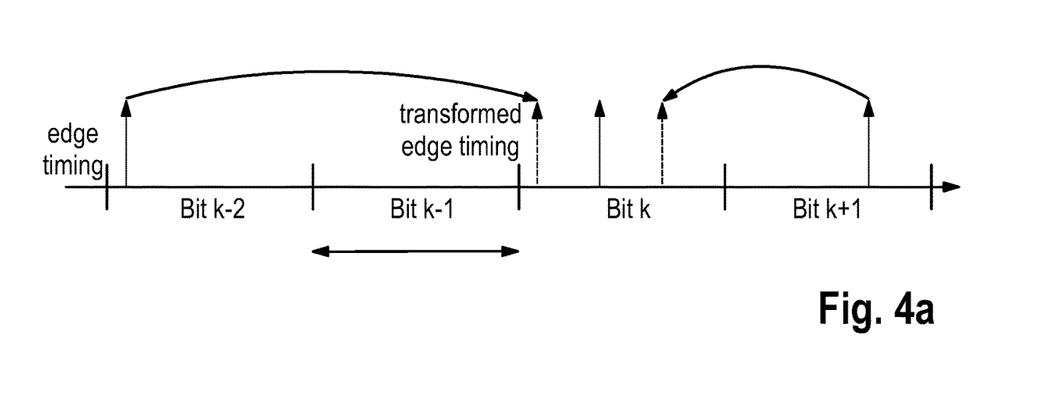
FIG. 4a shows an example of evaluating the edge timings within a single bit period in accordance with the present disclosure.

The modulo transformation to one bit period interval allows a statistical evaluation of the edge timings within a single bit period as shown in FIG. 4a.

The accumulated edge timings $T_{Acc}[k, l]$ (DATA_ACC) as well as their number (CNT_DATA) are output by the accumulation and compensation calculation module 16 so that the following offset selection module 18 is enabled to process the respective data.

Besides the accumulated edge timings $T_{Acc}[k, l]$ (DATA_ACC) and their number (CNT_DATA), the accumulation and compensation calculation module 16 also outputs the signal for resetting the clock data recovery (RESTART), the indicator for indicating the end of the virtual system clock (VSP_FULL) as well as the ending time of the current system clock (SP_TIME_END) as shown in FIG. 1.

In a fourth step S4, the offset selection module 18 receives and processes the output data of the accumulation and compensation calculation module 16.

The offset selection module 18 is configured to determine a time offset as the base value for the clock signal. In fact, the offset selection module 18 can access a number of different time offset values for evaluating purposes, namely $N_{off}$ time offset values.

For each of these time offset values, the bit period interval is shifted appropriately. The edge timings $T_{Acc}[k, l]$ within the respective bit period interval are updated as follows:

$$T_{Corr,m}[k, l] = \left(T_{Acc}[k, l] + \frac{\tilde{T}_b[k]}{2} - T_{Off,m}\right) \bmod \tilde{T}_b[k],$$

$$l = 0, \ldots, N_{Data,Acc} - 1; m = 0, \ldots, N_{Off} - 1$$

Figure 4B:
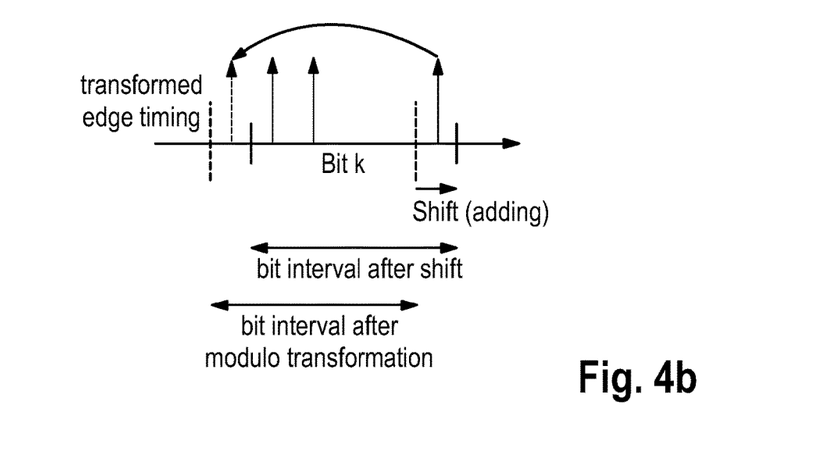
FIG. 4b shows an example of updating edge timing within a bit period interval in accordance with the present disclosure.

This principle is shown in FIG. 4b.

Thus, the time offset to be applied is chosen from a number of different time offsets by evaluating the difference of the accumulated edge timings $T_{Acc}[k, l]$ with respect to the center of the bit period interval $$\frac{\tilde{T}_b[k]}{2}$$

as shown hereinafter:

$$\Delta_{Corr,m}[k, l] = T_{Corr,m}[k, l] - \frac{\tilde{T}_b[k]}{2}, l = 0, \ldots, N_{Data,Acc} - 1$$

This can also be calculated as follows:

$$\Delta_{Corr,m}[k, l] = \begin{cases} T_{Acc}[k, l] - T_{Off,m}, & \text{if } T_{Acc}[k, l] - T_{Off,m} < \frac{\tilde{T}_b[k]}{2} \\ T_{Acc}[k, l] - T_{Off,m} - \tilde{T}_b[k], & \text{else} \end{cases}$$

$$l = 0, \ldots, N_{DataAcc} - 1.$$

Then, the sum of the absolute values of these differences is created wherein the time offset value resulting yielding the lowest value is chosen according to:

$$s[k] = \underset{m}{\operatorname{argmin}} \sum_{l=0}^{N_{Data,x}-1} |\Delta_{Corr,m}[k, l]|,$$

wherein $1 \leq N_{Data,x} \leq N_{Data,Acc}$ and $x \in \{Start, End\}$.

At the beginning $N_{Data,x}=1$, wherein $N_{Data,x}=N_{Data,Start}$ once $N_{Data,Start}$ have been accumulated. As soon as $N_{Data,End}$ edge timings have been accumulated and a defined number of system clock cycles $N_{Cyc,Sw}$ has expired, $N_{Data,x}=N_{Data,End}$ applies.

When changing to $N_{Data,x}=N_{Data,End}$, the lock state of the CDR Lock$_{CDR}$ changes from 0 to 1. As soon as the lock state of the bit period estimate Lock$_{Tb}$ also changes from 0 to 1 at the input, the change Lock$_{CDR}$ changes from 1 to 2 and thus the lock state is reached.

Either the offset value $T_{Off,s[k]}[k]$ can be used for further processing or the offset value determined can be corrected by adding the mean value of the differences. This allows a more accurate offset value to be obtained for the clock signal. The mean value of the differences may be added as follows to the offset value determined:

$$\tilde{T}_{Off}[k] = T_{Off,s[k]}[k] + \frac{1}{N_{Data,Acc}} \sum_{l=0}^{N_{Data,x}-1} \Delta_{Corr,m}[k, l]$$

The offset selection module 18 outputs at least the time offset determined $T_{Off,s[k]}[k]$ or rather the corrected time offset $\tilde{T}_{Off}[k]$ (DATA_OFFSET) as well as the lock status of the clock data recovery (LOCK_CDR) as shown in FIG. 1.

Besides the time offset determined $T_{Off,s[k]}[k]$ or rather the corrected time offset $\tilde{T}_{Off}[k]$ (DATA_OFFSET) as well as the lock status of the clock data recovery (LOCK_CDR), the offset selection module 18 also outputs the signal for resetting the clock data recovery (RESTART), the indicator for indicating the end of the virtual system clock (VSP_FULL) and the ending time of the current system clock (SP_TIME_END).

In a fifth step S5, the front clock generation module 20 receives the respective data and processes the data to determine the number of edges $N_{Clk,V}[k]$ within the (virtual) system clock as well as the value of the last edge timing $\tilde{T}_{Clk,last}[k]$ within the (virtual) system clock. The last edge timing $\tilde{T}_{Clk,last}[k]$ is assigned to the reference clock signal used for determining the clock signal.

The last edge timing $\tilde{T}_{Clk,last}[k]$ within the (virtual) system clock is calculated based on the basis value $T_{Base}[k] = \tilde{T}_{Off}[k] + \Delta_{Clk}$ and the standardized bit period $\tilde{T}_b[k]$. In fact, $\Delta_{Clk}$ corresponds to the offset of the clock signal with respect to the mean edge transition. Typically, $\Delta_{Clk} = \tilde{T}_0/2$ with the (standardized) nominal bit period $\tilde{T}_0$.

Figure 3:
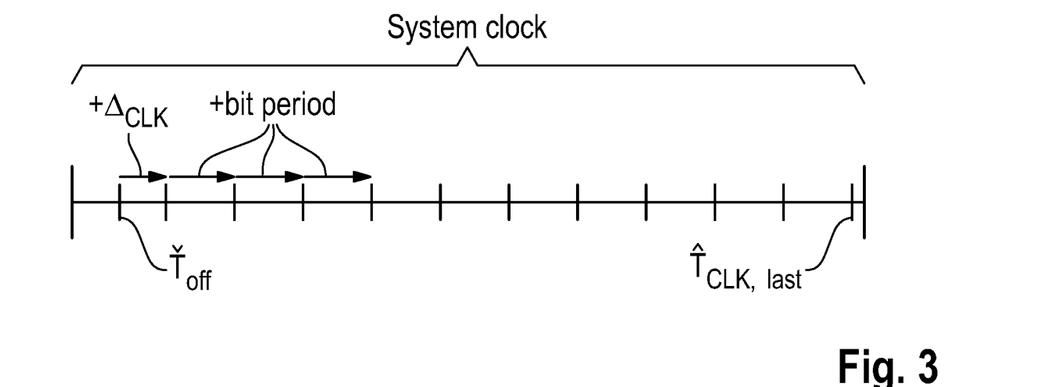
FIG. 3 shows an example calculation of an edge timing in accordance with the present disclosure.

The respective calculation is also illustrated in FIG. 3. It becomes obvious that the last edge timing $\tilde{T}_{Clk,last}[k]$ within the (virtual) system clock corresponds to the reference clock signal. In fact, the last edge timing $\tilde{T}_{Clk,last}[k]$ is assigned to the last bit within the (virtual) system clock.

The distance between two clock timings must be $>\tilde{T}_b[k]/2$ and $\leq 3 \tilde{T}_b[k]/2$. Accordingly, the first bit within the (virtual) system clock must be cancelled, remains or is added so as to obtain consistence between the previous (virtual) system clock and the current one.

Thus, the number of edges or rather edge timings $N_{Clk,V}[k]$ in the actual system clock can be obtained.

The front clock generation module 20 outputs inter alia the last edge timing $\tilde{T}_{Clk,last}[k]$ (CLK_VSP) within the current (virtual) system clock as well as the edge timing $\tilde{T}_{Clk,last}[k - 2^{\mu VSP}]$ (CLK_VSP_PRV) of the previous (virtual) system clock as well as the number of edges $N_{Clk,V}[k]$ (N_CLK_V) as shown in FIG. 1.

Besides this data, the front clock generation module 20 also outputs the signal for resetting the clock data recovery (RESTART), the indicator for indicating the end of the virtual system clock (VSP_FULL), the ending time of the current system clock (SP_TIME_END) as well as the lock status of the clock data recovery (LOCK_CDR).

In a sixth step S6, the clock module 22 receives and processes the data appropriately.

Hence, the reference clock signals, namely the one assigned to the last edge timings, are used to determine the clock signal by interpolation provided that more than one clock signal is present in the system clock. The reference clock signal of the current system clock k as well as the one of the previous system clock k−1 are used and interpolated in a linear manner for generating the interposing clock signals:

$$\tilde{T}_{Clk}[k, l] = \tilde{T}_{Clk,last}[k - 1] + (1 + l)\frac{\tilde{T}_{Clk,last}[k] - \tilde{T}_{Clk,last}[k - 1]}{N_{Clk,V}[k]},$$

$$l = 0, \ldots, P_{Clk} - 1$$

The respective clock signals $\tilde{T}_{Clk}[k,l]$ (CLK_VSP_INT) and their number (N_CLK_V_OUT) are output.

Provided that a normalization and virtualization module 14 was used as shown in the embodiment of FIG. 1, the respecting virtualization and normalization is reversed by the subsequent de-normalization and de-virtualization module 24 in a seventh step S7.

Hence, the de-normalization and de-virtualization provides clock signals that relate to the (non-virtual) system clock (CLK_SIG_OUT) which are output by the de-normalization and de-virtualization module 24 and obtained as follows:

$$T_{Clk}[k,l] = \tilde{T}_{Clk}[k,l] \cdot 2^{\mu VSP} - T_{VSP}[k], l=0, \ldots, P_{Clk}-1$$

Furthermore, the unlock-status of the clock data recovery (UNLOCK_CDR) is output.

As shown in FIG. 1, the number of valid clock signals $N_{Clk,V}[k]$(N_CLK_V_OUT), the signal for resetting the clock data recovery (RESTART_OUT) and the lock-status of the clock data recovery (UNLOCK_CDR) are output.

In an eighth step S8, the transition density calculation module 26 determines the mean number of the clock signals and edges. The calculation is done by means of an infinite impulse response filter (IIR filter) of first order as shown hereinafter:

$$\overline{N}_x[k] = (1-2^{-L}) \cdot \overline{N}_x[k-1] + 2^{-L} \cdot N_x[k]$$

wherein $x \in \{Data, Clock\}$, $L=3, \ldots, 15$, and wherein $N_x[k]$ corresponds to the number of clock signals or rather edges (N_CLK_AVG_VSP or rather N_DATA_AVG_VSP) within the current system clock.

Hence, the current system clock may comprise several bit periods, clock signals assigned to the bit periods or rather clock edges.

Furthermore, threshold(s) may be set to define a range of accepted values for the mean number of cycle signals or rather. In case of exceeding or rather falling below the threshold(s), an indication by means of $TD_{High}$ or rather $TD_{Low}$ is output (TD_HIGH or rather TD_LOW). Hence, breaching or rather violating the range of accepted values is indicated. The breaching or rather violating may be assigned to an exceeding or rather falling below the respective threshold(s).

In a ninth step S9, the optional bit period calculation module 28 may estimate a bit period that is fed back to the accumulation and compensation calculation module 16, the offset selection module 18 and/or the front clock generation module 20 as shown in FIG. 1. If no feedback occurs, the nominal (pre-set) bit period is used.

The feedback generally ensures the support of spread spectrum clocking (SSC) modulated signals where larger frequency shifts occur with slow changes. Due to the slow change of the bit period, the feedback is not latency critical.

The estimation of the bit period is done by an infinite impulse response filter (IIR filter) of first order wherein the distance $\Delta_{Clk}[k]$ between two clock signals is used for all $N_{Cyc,BPU}$ system clocks for updating purposes:

$$\hat{T}_b[k] = \alpha \hat{T}_b[k - N_{Cyc,BPU}] + b \cdot \Delta_{Clk}[k]$$

The coefficients a and b are determined by the constant number of clock signals covered by the distance $\Delta_{Clk}[k]$ as well as the (desired) setting of the filter, in particular its speed.

Besides the feedback of the estimated bit period $\hat{T}_b[k]$ (TB_TEST), the lock state of the bit period estimation $Lock_{Tb}$ (LOCK_TB_EST) is also forwarded to the accumulation and compensation calculation module 16. The status is only 1 in case of $Lock_{CDR} \geq 1$ and a defined number of clock signals $N_{Clk,Tb}$ has occurred after the last change from 0 to 1.

Once the clock signals have been recovered from the data signal based on the edge timings as described above, the data signal is sampled with the respective clock signals in a tenth step S10.

As the steps S7 to S9 are optional ones, the sampling may take place after the sixth step S6 once the clock signals were determined by the clock module 22.

Figure 6:
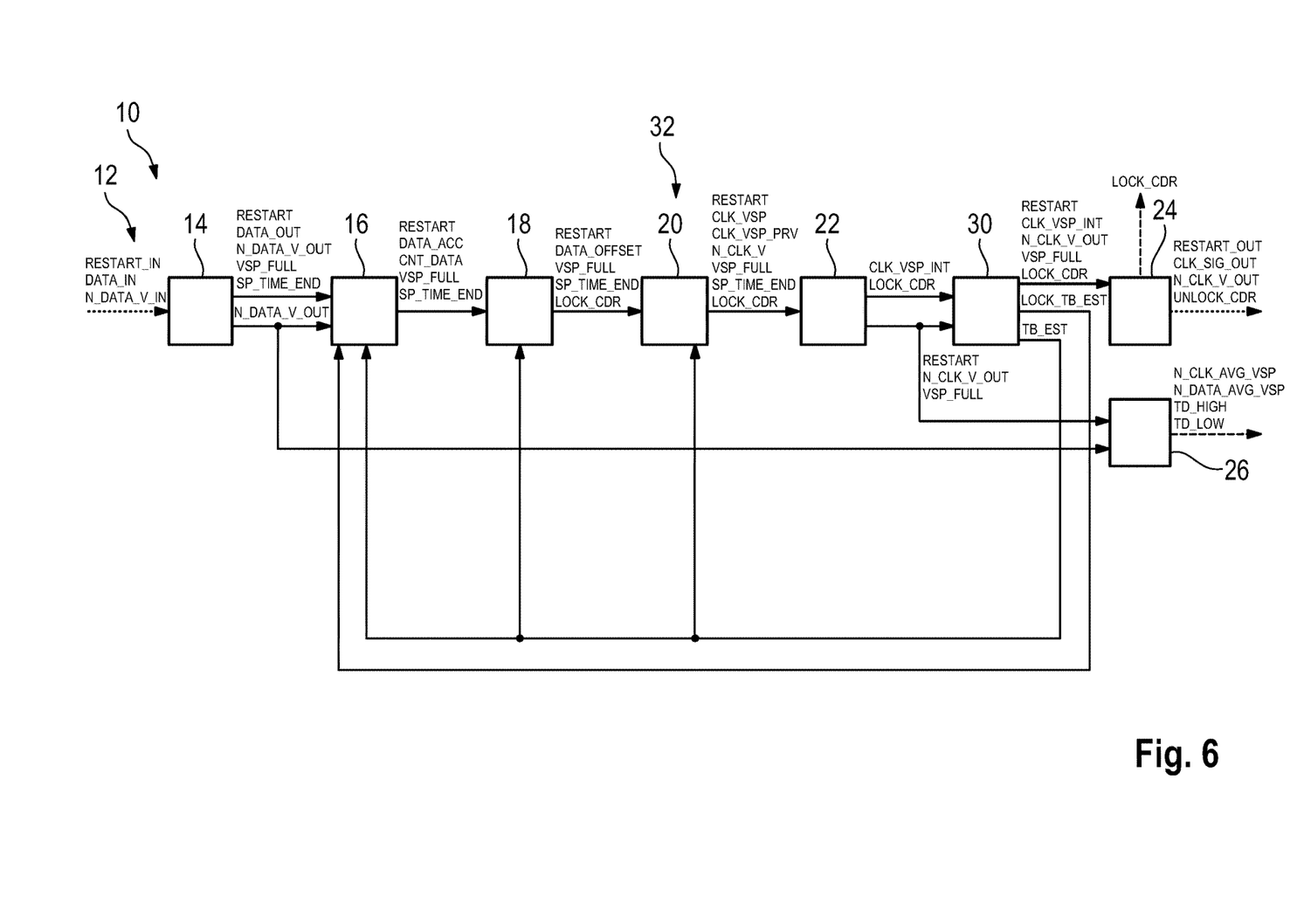
FIG. 6 shows a clock recovery module according to another embodiment of the present disclosure.

In FIG. 6, another embodiment is shown that comprises a post-processing unit 30 instead of the bit period calculation module 28. The post-processing unit 30 is interconnected between the clock module 22 and the de-normalization and de-virtualization module 24.

The number of accumulated edge timings $T_{Acc}[k, l]$ is limited yielding a high adaption speed of the clock data recovery with respect to the data signal which corresponds to a high bandwidth of a phase-locked loop (PLL). In general, this is advantageous for successful data recovery.

However, in case of a low bandwidth being desired, a post-processing is necessary.

The post-processing is based on an estimation of (standardized) clock signal timings $\tilde{T}_{Clk}$ as well as a (standardized) bit period $\tilde{T}_b$ of N (standardized) edge timings $\tilde{T}_{Data}[k]$, $k=0, \ldots, N-1$.

The estimation is separated in two optimization problems.

In fact, a criterion is provided for the bit period and another criterion is provided for the (other) clock signal. For estimating the clock signal timing, the minimum of the following criterion has to be determined:

$$L_0(\tilde{T}_{Clk}) = \sum_{k=0}^{N-1} (\tilde{T}_{Data}[k] - \tilde{T}_{Clk} - n[k] \cdot \tilde{T}_b)^2,$$

wherein n[k] corresponds to the bit position of the k-th edge related to the clock signal. Thus, the clock signal timing $\tilde{T}_{Clk}$ is yield in dependency of the bit period $\tilde{T}_b$ as follows:

$$T_{Clk} = \frac{1}{N} \sum_{k=0}^{N-1} (\tilde{T}_{Data}[k] - n[k] \cdot \tilde{T}_b)$$

For estimating the bit period $\tilde{T}_b$, the minimum of the following criterion (for even N) is to be determined:

$$L_1(\tilde{T}_b) = \sum_{k=0}^{N/2-1} ((\tilde{T}_{Data}[k] - \tilde{T}_{Data}[k + N/2]) - (n[k] - n[k + N/2]) \cdot \tilde{T}_b)^2$$

The bit period $\tilde{T}_b$ is:

$$\tilde{T}_b = \frac{\sum_{k=0}^{N/2-1} ((\tilde{T}_{Data}[k] - \tilde{T}_{Data}[k + N/2]) \cdot (n[k] - n[k + N/2]))}{\sum_{k=0}^{N/2-1} (n[k] - n[k + N/2])^2}$$

Inserting $\tilde{T}_b$ as defined above in $$\tilde{T}_{Clk} = \frac{1}{N}\sum_{k=0}^{N-1}(\tilde{T}_{Data}[k]-n[k]\cdot \tilde{T}_b)$$

yields the clock signal timing $\tilde{T}_{Clk}$.

No complex calculations are required with the exception of some multiplications. The sums can be continuously updated according to the "first in, first out" (FIFO) principle by subtracting a delayed signal.

Figure 5:
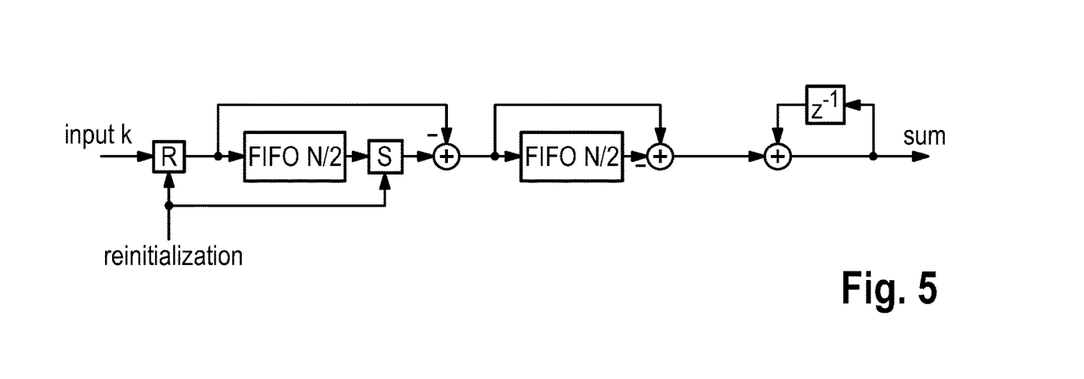
FIG. 5 shows an example of several steps for correcting data output from the FIFO memories.

The reference position for the data edges and the clock signals must be reinitialized at regular intervals to avoid an overflow. A corresponding correction must be made for the data output from the FIFO memories until reinitialized data is output.

The respective principle is outlined in FIG. 5 for a sum in the following form $g[k]=\Sigma_{l=k-N/2+1}^{k}(x[l-N/2]-x[l])$.

As shown in FIG. 5, the R block performs the reinitialization at the input and the S block the correction of the data from the FIFO memory.

As already described, the modules described herein may be established by software modules so that a computer program 32 is provided that may be used by the clock recovery module 10. The computer program 32 has a program code adapted to cause the clock recovery module 10 to perform the steps mentioned above when the computer program 32 is run on the clock recovery module 10. Alternatively, the modules may be established by hardware circuitry, or combination of software and hardware circuitry.

It will then be appreciated that one or more aspects of the methods set forth herein can be carried out in a computer system. In this regard, a program element is provided, which is configured and arranged when executed on a computer to recover a clock signal from a data signal. In one embodiment, the program element may specifically be configured to perform the steps of: accumulating edge timings of the data signal, transforming the edge timings accumulated into one reference bit period, determining a time offset for the reference bit period, determining a reference clock signal based on the time offset, determining the number of bits within a system clock of the clock recovery module, and recovering the clock signal based on the reference clock signal and the number of bits. In other embodiments, the program element may be specifically configured to perform the steps of Claims 2-6.

The program element may be installed in memory, such as computer readable storage medium. The computer readable storage medium may be any one of the computing devices, modules, instruments, analyzers, post processing units, etc., described elsewhere herein or another and separate computing device, modules, instruments, analyzers, post processing unit, etc., as may be desirable. The computer readable storage medium and the program element, which may comprise computer-readable program code portions embodied therein, may further be contained within a non-transitory computer program product.

As mentioned, various embodiments of the present disclosure may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, optical disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Other non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM) of any rate, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

The computer-readable media include cooperating or interconnected computer-readable media, which exist exclusively on a processing system or distributed among multiple interconnected processing systems that may be local to, or remote from, the processing system.

As should be appreciated, various embodiments of the present disclosure may be also implemented as methods, apparatus, systems, computing devices, computing entities, and/or the like, as have been described elsewhere herein or claimed below. As such, embodiments of the present disclosure may take the form of an apparatus, system, computing device, computing entity, and/or the like executing instructions stored on a computer-readable storage medium to perform certain steps or operations. However, embodiments of the present disclosure may also take the form of an entirely hardware embodiment performing certain steps or operations.

Various embodiments are described above with reference to block diagrams and/or flowchart illustrations of apparatuses, methods, systems, and computer program products. It should be understood that each block of any of the block diagrams and/or flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks and/or carry out the methods described herein.

These computer program instructions may also be stored in a computer-readable memory, such as the computer-readable storage media described above, that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, could be implemented by special purpose hardware-based computer systems or circuits, etc., that perform the specified functions or operations, or combinations of special purpose hardware and computer instructions.

According to some embodiments, many individual steps of a process may or may not be carried out utilizing the computer systems described herein, and the degree of computer implementation may vary, as may be desirable and/or beneficial for one or more particular applications.

It should now be appreciated that some embodiments of the present disclosure, or portions thereof, have been described in the general context of computer code or machine-useable instructions, including computer-executable instructions such as program modules, being executed by a computing system, or other machine or machines. Some of these embodiments or others may be implemented using a variety of system configurations, including handheld devices, consumer electronics, general-purpose computers, more specialty computing devices, etc. Embodiments described herein may also be implemented in distributed computing environments, using remote-processing devices that are linked through a communications network or the Internet.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The embodiments of the invention in which an exclusive property or privilege is claimed are defined as follows:

1. A method for recovering a clock signal from a data signal by using a clock recovery circuit, with the following steps:
   accumulating edge timings of the data signal,
   transforming the edge timings accumulated into one reference bit period,
   determining a time offset for the reference bit period,
   determining a reference clock signal based on the time offset,
   determining the number of bits within a system clock of the clock recovery circuit, and
   recovering the clock signal based on the reference clock signal and the number of bits.

2. The method according to claim 1, wherein the clock signal is recovered by an interpolation on the reference clock signal and the number of bits.

3. The method according to claim 1, wherein another clock signal is estimated based on the edge timings.

4. The method according to claim 1, wherein a bit period is estimated.

5. The method according to claim 1, wherein several system clocks are summarized to a virtual system clock, and wherein the virtual system clock is de-virtualized afterwards.

6. The method according to claim 5, wherein the edge timings in the virtual system clock are normalized, and wherein the normalized edge timings are de-virtualized after the clock signal is recovered.

7. The method according to claim 1, wherein the value of the time offset determined is corrected to obtain a corrected time offset, and wherein the corrected time offset is the sum of the time offset determined and averaged deviations from the time offset determined.

8. The method according to claim 1, wherein the transformation of the edge timings for obtaining the reference bit period relates to a modulo transformation allowing a statistical evaluation of the edge timings within a bit period.

9. The method according to claim 1, wherein the edge timings are transformed in one bit period interval for further evaluation by applying a modulo transformation.

10. A clock recovery circuitry for recovering a clock signal from a data signal, comprising an accumulation and compensation calculation circuitry, an offset selection circuitry, a front clock generation circuitry and a clock circuitry, wherein
   the accumulation and compensation calculation circuitry is configured to accumulate edge timings of the data signal,
   the accumulation and compensation calculation circuitry is configured to transform the edge timings accumulated into one reference bit period,
   the offset selection circuitry is configured to determine a time offset for the reference bit period,
   the front clock generation circuitry is configured to determine a reference clock signal based on the time offset,
   the front clock generation circuitry is configured to determine the number of bits within a system clock of the clock recovery circuitry, and
   the clock circuitry is configured to recover the clock signal based on the reference clock signal and the number of bits.

11. The clock recovery circuitry according to claim 10, wherein a virtualization and normalization circuitry is provided that is configured to summarize several system clocks to a virtual system clock and to normalize the edge timings within the virtual system clock.

12. The clock recovery circuitry according to claim 11, wherein a de-normalization and de-virtualization circuitry is provided that is configured to reverse the result of the virtualization and normalization circuitry.

13. The clock recovery circuitry according to claim 10, wherein a post-processing circuitry is provided that is configured to estimate at least one of a bit period and another clock signal is estimated based on the edge timings.

14. The clock recovery circuitry according to claim 10, wherein a bit period calculation circuitry is provided that is configured to feed back an estimated bit period to at least one of the accumulation and compensation calculation circuitry, the offset selection circuitry and the front clock generation circuitry.

15. The clock recovery circuitry according to claim 10, wherein a transition density calculation circuitry is provided that is configured to determine a mean value of the clock signals and edge timings.

16. The clock recovery circuitry according to claim 10, wherein the clock recovery circuitry is configured to perform the method for recovering a clock signal from a data signal according to claim 1.

17. The clock recovery circuitry according to claim 10, wherein the accumulation and compensation calculation circuitry is configured to perform a modulo transformation allowing a statistical evaluation of the edge timings within a bit period.

18. The clock recovery circuitry according to claim 10, wherein the accumulation and compensation calculation circuitry is configured to transform the edge timings in one bit period interval for further evaluation by applying a modulo transformation.

19. A non-transitory computer-readable medium storing executable instructions, that when executed by one or more computing devices, cause the one or more computing devices to perform the following steps:
    accumulating edge timings of the data signal,
    transforming the edge timings accumulated into one reference bit period,
    determining a time offset for the reference bit period,
    determining a reference clock signal based on the time offset,
    determining the number of bits within a system clock, and
    recovering the clock signal based on the reference clock signal and the number of bits.

20. The non-transitory computer readable medium according to claim 19, wherein the transformation of the edge timings for obtaining the reference bit period relates to a modulo transformation allowing a statistical evaluation of the edge timings within a bit period or wherein the edge timings are transformed in one bit period interval for further evaluation by applying a modulo transformation.

* * * * *